US012596151B2

(12) United States Patent
Shen et al.

(10) Patent No.: US 12,596,151 B2
(45) Date of Patent: Apr. 7, 2026

(54) SYSTEM AND METHOD FOR TESTING PERFORMANCE OF RELAY CONTACT BASED ON INFRARED THERMAL IMAGING

(71) Applicant: China Special Equipment Inspection and Research Institute, Beijing (CN)

(72) Inventors: Gongtian Shen, Beijing (CN); Zunxiang Wang, Beijing (CN); Ran Liu, Beijing (CN); Zhao Zhao, Beijing (CN); Zhimao Xu, Beijing (CN); Wei Zhao, Beijing (CN)

(73) Assignee: China Special Equipment Inspection and Research Institute, Beijing (CN)

( * ) Notice: Subject to any disclaimer, the term of this patent is extended or adjusted under 35 U.S.C. 154(b) by 303 days.

(21) Appl. No.: 18/409,342

(22) Filed: Jan. 10, 2024

(65) Prior Publication Data

US 2024/0230762 A1     Jul. 11, 2024

(30) Foreign Application Priority Data

Jan. 10, 2023     (CN) .......................... 202310030599.2

(51) Int. Cl.
G01R 31/327 (2006.01)
G01J 5/00 (2022.01)
(52) U.S. Cl.
CPC ............ *G01R 31/3278* (2013.01); *G01J 5/00* (2013.01); *G01J 2005/0077* (2013.01)

(58) Field of Classification Search
CPC .................................................. G01R 31/3278
See application file for complete search history.

(56) References Cited

FOREIGN PATENT DOCUMENTS

CN          104880486 A  *  9/2015
CN          113916938 A  *  1/2022  ............ G01J 5/0096
KR          101421591 B1 *  8/2014

* cited by examiner

*Primary Examiner* — Walter L Lindsay, Jr.
*Assistant Examiner* — Milton Gonzalez
(74) *Attorney, Agent, or Firm* — Jacob M. Ward; Ward Law Office LLC

(57) ABSTRACT

The present disclosure provides a system and method for testing performance of a relay contact based on infrared thermal imaging, and relates to the field of performance testing of relay contacts. The system includes a collection device, a testing device, and a time relay. The testing device is separately connected to a tested relay and the time relay, and configured to control closing and release of a contact of the tested relay by using the time relay. The collection device is connected to the testing device, and configured to collect a temperature, a closing quantity, and working duration of the contact of the tested relay. The present disclosure resolves a limitation in existing performance testing methods for intermediate relays, which predominantly concentrate on individual parameters like voltage, current, and time, while overlooking the assessment of contact performance.

10 Claims, 4 Drawing Sheets

IP24                                                                                    N24

SA1-2          KM1        KT0
Control a
power switch                      A1   A2   ⑤   ⑧

KM1(NO)         HL1
Control a power
indication

KM1-1          KT1          KT2
Power-on delay
relay                    ⑦   ②      ⑤   ⑧

KT2          KT1
⑦   ②      ⑥   ⑧

KM1-2          KA2        KT2
Intermediate relay
(control)                14   13   ①   ③

KA1      KA2-1  FL ( Diverter 50A)
14   13   ⑨   ⑤

KM1-3 R (slide rheostat)                          Ampere-
Slide rheostat                              IP24        Ⓐ   voltage meter
(current adjustment)

Counter C1
④   ③
①   ②   KA1-3
⑨   ⑤

FIG. 3

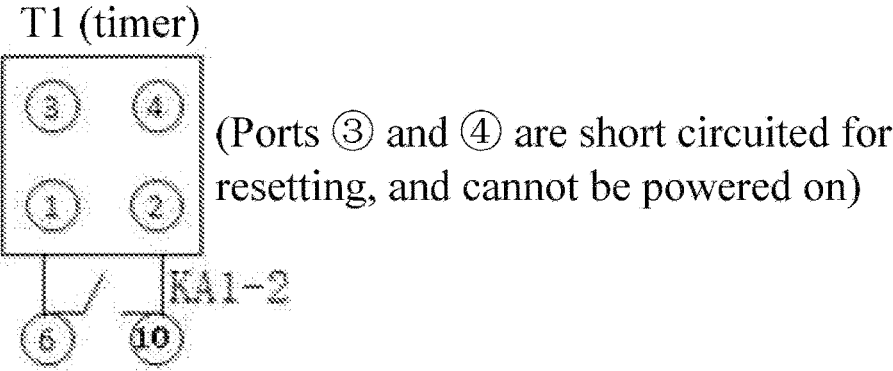

T1 (timer)
③   ④
①   ②

(Ports ③ and ④ are short circuited for
resetting, and cannot be powered on)

SYSTEM AND METHOD FOR TESTING PERFORMANCE OF RELAY CONTACT BASED ON INFRARED THERMAL IMAGING

CROSS REFERENCE TO RELATED APPLICATION

This patent application claims the benefit and priority of Chinese Patent Application No. 202310030599.2, filed with the China National Intellectual Property Administration on Jan. 10, 2023, the disclosure of which is incorporated by reference herein in its entirety as part of the present application.

TECHNICAL FIELD

The present disclosure relates to the field of performance testing of relay contacts, and in particular, to a system and method for testing performance of a relay contact based on infrared thermal imaging.

BACKGROUND

In the prior art, the performances of a relay are usually tested one by one, for example, resistance test, voltage test, and current test. No performance test method is available for a contact that is prone to a fault. Traditional performance test methods include resistance test, and voltage & current test. The resistance test uses a multimeter to measure an ohmic value of a coil. The voltage & current test uses an adjustable regulated power supply and an ammeter. The ammeter is connected in series to a test circuit, a voltage value of the regulated power supply is continuously increased until sound of contact closing is heard, and voltage and current values at this moment are recorded. An average value is obtained by performing the measurement for a plurality of times to obtain a closing voltage and current. Similarly, the closing voltage is gradually reduced until sound of contact release is heard, and voltage and current values at this moment are recorded to obtain a release voltage and current. All existing relay performance tests are conducted to measure resistance of a circuit by using the multimeter and test relay performance by using the adjustable regulated power supply and the ammeter, and have following drawbacks:

1) Individual parameters such as the resistance, the voltage, and the current are tested, but there is no device or method for testing performance of a contact that is an important component.
2) The current testing method cannot reflect actual performance of the contact under an actual working condition that the contact is continuously closed and released.
3) Testing efficiency is low, especially for batch testing, which requires personnel to manually record and summarize relevant test data.
4) In a testing process, a regulated power supply circuit needs to be replaced and assembled, which poses a risk of electric shock.

SUMMARY

The primary aim of this disclosure is to present a system and method designed for evaluating the performance of relay contacts using infrared thermal imaging. This addresses a limitation in existing performance testing methods for intermediate relays, which predominantly concentrate on individual parameters like voltage, current, and time, while overlooking the assessment of contact performance.

To achieve the above purpose, the present disclosure provides the following technical solutions:

A system for testing performance of a relay contact based on infrared thermal imaging includes a collection device, a testing device, and a time relay; the testing device is separately connected to a tested relay and the time relay, and configured to control closing and release of a contact of the tested relay by using the time relay; and the collection device is connected to the testing device, and configured to collect a temperature, a closing quantity, and working duration of the contact of the tested relay.

Optionally, the collection device comprises an infrared thermal imager, a counter, and a timer.

Optionally, the collection device further comprises an ampere-voltage meter, and the ampere-voltage meter is configured to detect a value of current flowing through the contact of the tested relay.

Optionally, the testing device comprises a power module, a power switch, a slide rheostat, a direct current (DC) contactor, a diverter, and an intermediate relay; and the time relay comprises a first time relay and a second time relay; the power module is separately connected to the slide rheostat, the DC contactor, and the intermediate relay, and configured to convert a 220 V alternating current (AC) into a 24 V DC and supply power to the slide rheostat, the DC contactor, and the intermediate relay; a positive terminal of the power module is connected to one contact of a third group of contacts of a main contact of the DC contactor; another contact of the third group of contacts of the main contact of the DC contactor is connected to one terminal of the slide rheostat; the other terminal of the slide rheostat is separately connected to one contact of the tested relay and an output terminal of a coil of the intermediate relay; another contact of the tested relay is connected to one end of a main circuit of the diverter; the other end of the main circuit of the diverter is connected to a negative terminal of the power module; a current detection loop terminal of the diverter is connected to a current detection terminal of the ampere-voltage meter; a voltage detection terminal of the ampere-voltage meter is connected to the positive terminal of the power module; an input terminal of the coil of the intermediate relay is connected to one contact of a second group of contacts of the main contact of the DC contactor; another contact of the second group of contacts of the main contact of the DC contactor is connected to the positive terminal of the power module; an input terminal of a coil of the tested relay is connected to one contact of the second group of contacts of the main contact of the DC contactor; an output terminal of the coil of the tested relay is connected to one of normally open contacts of the second time relay; and another one of the normally open contacts of the second time relay is connected to the negative terminal of the power module; the positive terminal of the power module is connected to one contact of a first group of contacts of the main contact of the DC contactor; another contact of the first group of contacts of the main contact of the DC contactor is separately connected to an input terminal of a coil of the first time relay and an input terminal of a coil of the second time relay; an output terminal of the coil of the first time relay is connected to one of power-on off-delay contacts of the second time relay; another one of the power-on off-delay contacts of the second time relay is connected to the negative terminal of the power module; an output terminal of the coil of the second time relay is connected to one of normally open contacts of the first time relay; and another one of the normally open contacts of the first time relay is connected to the negative terminal of the power module; and the positive terminal of the power module is connected to one terminal of the power switch; another terminal of the power switch is connected to an input terminal of a coil of the DC contactor; and an output terminal of the coil of the DC contactor is connected to the negative terminal of the power module.

Optionally, the positive terminal of the power module is connected to a fourth wiring terminal of the counter; and the negative terminal of the power module is connected to a third wiring terminal of the counter; and a first wiring terminal of the counter is connected to one contact of a third group of normally open contacts of the intermediate relay; and a second wiring terminal of the counter is connected to another contact of the third group of normally open contacts of the intermediate relay.

Optionally, a first wiring terminal of the timer is connected to one contact of a second group of normally open contacts of the intermediate relay; and a second wiring terminal of the timer is connected to another contact of the second group of normally open contacts of the intermediate relay.

Optionally, a resistance range of the slide rheostat is 1.2Ω to 10Ω.

Optionally, the time relay further comprises a third time relay, and the testing device further comprises an AC switch; one of normally closed contacts of the third time relay is connected to the output terminal of the coil of the DC contactor; and another one of the normally closed contacts of the third time relay is connected to the negative terminal of the power module; an input terminal of the power module is connected to the 220V AC; and an output terminal of the power module outputs the 24 V DC; and a live line (L) terminal of the 220V AC is connected to one terminal of the AC switch; another terminal of the AC switch is connected to an input terminal of a coil of the third time relay; an output terminal of the coil of the third time relay is connected to one contact of a first group of normally closed contacts of the intermediate relay; and another contact of the first group of normally closed contacts of the intermediate relay is connected to a neutral line (N) terminal of the 220V AC.

Optionally, the testing system further comprises a testing base; and the tested relay is connected to the testing device through the testing base.

A method for testing performance of a relay contact based on infrared thermal imaging includes: closing a coil of a DC contactor; adjusting a resistance value of a slide rheostat to enable a current detected by an ampere-voltage meter to reach a specified current value, wherein the specified current value is determined based on a parameter of a tested relay; adjusting a first time relay and a second time relay to ensure that a time interval between closing and release of a contact of the tested relay meets a specified threshold, wherein the specified threshold is determined based on the parameter of the tested relay; collecting a temperature of the contact of the tested relay within a specified time period by using an infrared thermal imager; and determining a maximum working temperature of the contact of the tested relay based on the temperature.

According to specific embodiments provided in the present disclosure, the present disclosure has following technical effects:

The present disclosure provides a system for testing performance of a relay contact based on infrared thermal imaging. The system includes a collection device, a testing device, and a time relay. The testing device is separately connected to a tested relay and the time relay, and configured to control closing and release of a contact of the tested relay by using the time relay. The collection device is connected to the testing device, and configured to collect a temperature, a closing quantity, and working duration of the contact of the tested relay. Based on a principle that when a main component, namely, a contact, of a relay that is used as a commonly used component of a control circuit unit in a circuit control system has a problem, corresponding contact resistance changes significantly, and heat also changes significantly under the action of a current according to the Joule's law, the present disclosure uses an infrared thermal imaging technology to test performance of the contact of the relay. This can comprehensively reflect performance of the relay and addresses a limitation in existing performance testing methods for intermediate relays, which predominantly concentrate on individual parameters like voltage, current, and time, while overlooking the assessment of contact performance.

BRIEF DESCRIPTION OF THE DRAWINGS

To describe the technical solutions in embodiments of the present disclosure or in the prior art more clearly, the accompanying drawings required in the embodiments are briefly described below. Apparently, the accompanying drawings in the following description show merely some embodiments of the present disclosure, and other accompanying drawings can be derived from these accompanying drawings by those of ordinary skill in the art without creative efforts.

FIG. 3 is a test circuit diagram of a system for testing performance of a relay contact based on infrared thermal imaging according to the present disclosure;

FIG. 4 is a circuit diagram of connecting a timer of a system for testing performance of a relay contact based on infrared thermal imaging according to the present disclosure.

DETAILED DESCRIPTION OF THE EMBODIMENTS

Figure 1:
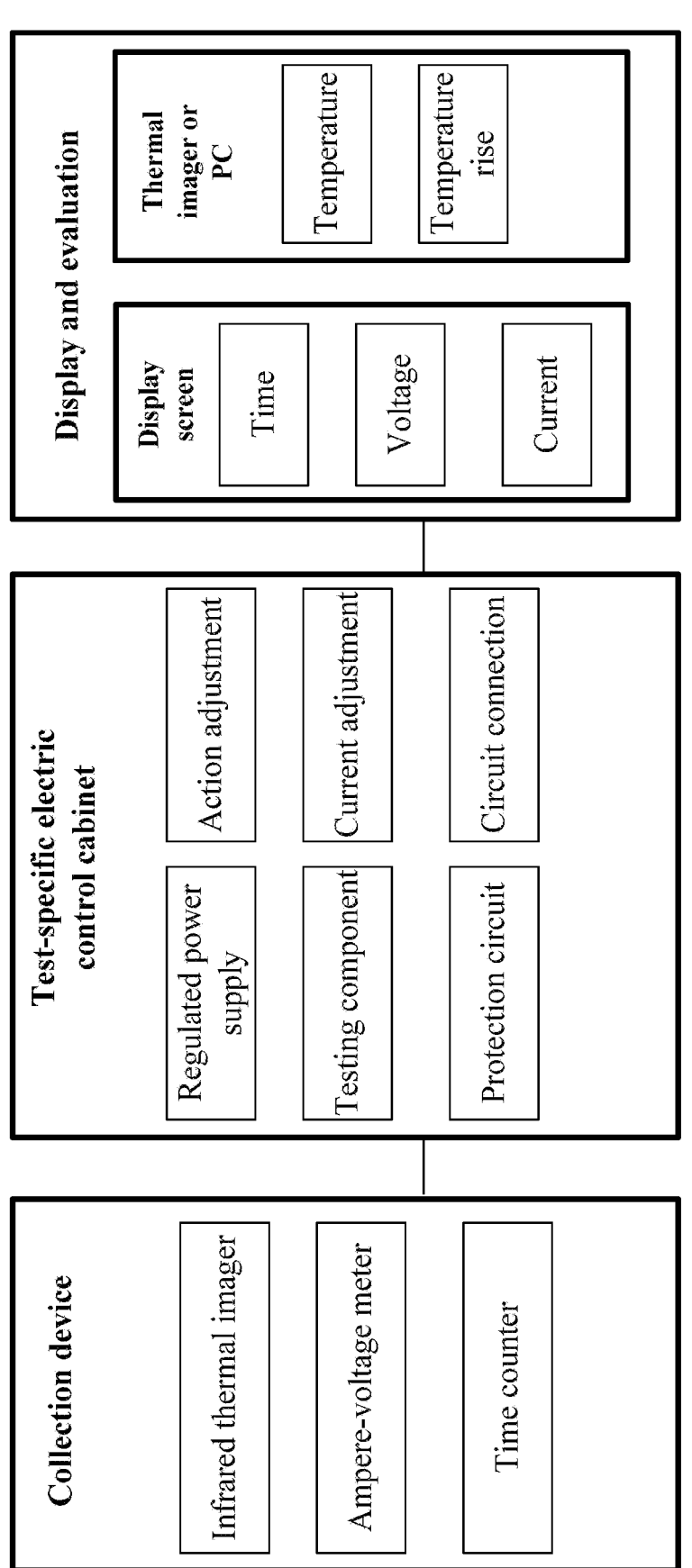
FIG. 1 shows modules of a system for testing performance of a relay contact based on infrared thermal imaging according to the present disclosure.

The technical solutions of the embodiments of the present disclosure are clearly and completely described below with reference to the accompanying drawings in the embodiments of the present disclosure. Apparently, the described embodiments are merely a part rather than all of the embodiments of the present disclosure. All other embodiments obtained by those skilled in the art based on the embodiments of the present disclosure without creative efforts shall fall within the protection scope of the present disclosure.

The primary aim of this disclosure is to present a system and method designed for evaluating the performance of relay contacts using infrared thermal imaging. This addresses a limitation in existing performance testing methods for intermediate relays, which predominantly concentrate on individual parameters like voltage, current, and time, while overlooking the assessment of contact performance.

Term explanation:

1. Relay: As a common control unit in an electrical system, the relay is mainly constituted by a contact, a wire, and a coil.
2. Contact: As a main component of a relay, the contact is closed and released continuously under the electromagnetic action, which causes collisions and frictions. Over time, problems such as wear, adhesion, and poor contact may occur. In addition, an installation problem such as a dry joint may occur in the contact, which is a most important cause of a failure of the relay.
3. Infrared thermal imaging technology: Similar to infrared temperature measurement in security inspection, the infrared thermal imaging technology collects a target temperature by using an infrared thermal imager, to determine whether the temperature is too high or a temperature rise is too large.

As a commonly used component of a control circuit unit in a circuit control system, an intermediate relay mainly plays a role in transmitting a signal. In this process, a function of using one control signal to control one or more other signals can be achieved to complete control such as start, stop, and linkage. A mainly controlled object is a contactor, which in turn controls an electrical component with a greater load-bearing capacity. A working principle of the intermediate relay is as follows: When a coil is powered on, a movable iron core acts and is closed under the action of electromagnetic force to drive a movable contact to act, so as to open a normally closed contact and close a normally open contact. When the coil is powered off, the movable iron core is driven by a spring to reset the movable contact. When an input quantity (such as voltage, current, temperature, speed, and pressure) reaches a predetermined value, the movable contact acts to change a working state of a control circuit, thereby achieving predetermined control or protection.

Long-term continuous closing poses a reliability requirement for quality of the contact of the relay. If a fault occurs on the contact, it is difficult to detect the fault directly from the outside. In addition, this type of fault may not occur frequently or in a fixed manner, and may occur occasionally. However, even if the fault occurs occasionally, contact resistance of the contact also changes, causing voltages at both ends of the coil to be lower than 85% of a rated voltage. As a result, the iron core cannot be closed, causing the circuit to lose control, and even endangering personal safety. At present, detection performed for the intermediate relay mainly focuses on measurement of resistance values at both ends of the coil. However, because the relay is protected by an external safety shell, when resistance of an internal coil is measured, the shell needs to be removed for testing. The removal process may cause damage to the shell. As a result, safety of using the relay subsequently cannot be guaranteed, and detection efficiency is low. In addition, the detection method for measuring the resistance needs to be performed after power-on, which poses a safety hazard.

In summary, the existing detection method has significant shortcomings in terms of accuracy, efficiency, and safety. Therefore, there is an urgent need for an efficient, safe, and accurate intermediate relay detection method to ensure that the relay is in a normal working state. However, the infrared thermal imaging technology can effectively resolve the above problems. When the relay is powered on, according to the Joule's law, Q=I²*RT, which means that work is done and heat is generated when current flows through a resistor. Through photoelectric conversion, the infrared thermal imager can convert thermal energy captured by a lens into a temperature for displaying, and normal temperature ranges of the intermediate relay under different load currents are determined based on an experiment. Then, a temperature measurement method is used to detect the intermediate relay, but there is currently no relevant testing device. A self-designed testing device and method of the present disclosure resolve this problem.

In order to make the above objective, features, and advantages of the present disclosure clearer and more comprehensible, the present disclosure will be further described in detail below in combination with accompanying drawings and particular implementation modes.

Embodiment 1

As shown in FIG. 1, the present disclosure provides a system for testing performance of a relay contact based on infrared thermal imaging. The system includes a collection device, a testing device, and a time relay.

The testing device is separately connected to a tested relay and the time relay, and configured to control closing and release of a contact of the tested relay by using the time relay. Specifically, the testing device includes a power module, a power switch, a slide rheostat, a direct current (DC) contactor, a diverter, and an intermediate relay. The time relay includes a first time relay and a second time relay. Further, a resistance range of the slide rheostat is 1.2Ω to 10Ω.

The collection device is connected to the testing device, and configured to collect a temperature, a closing quantity, and working duration of the contact of the tested relay. Specifically, the collection device includes an infrared thermal imager, a counter, and a timer. The collection device further includes an ampere-voltage meter, and the ampere-voltage meter is configured to detect a value of current flowing through the contact of the tested relay.

The system for testing performance of a relay contact based on infrared thermal imaging further includes a display screen and a controller. The collection device is connected to the controller and sends the temperature, the closing quantity, and the working duration to the controller. The controller is connected to the display screen and configured to send the received temperature, closing quantity, and working duration to the display screen. The display screen is configured to display the received temperature, closing quantity, and working duration.

Figure 2:
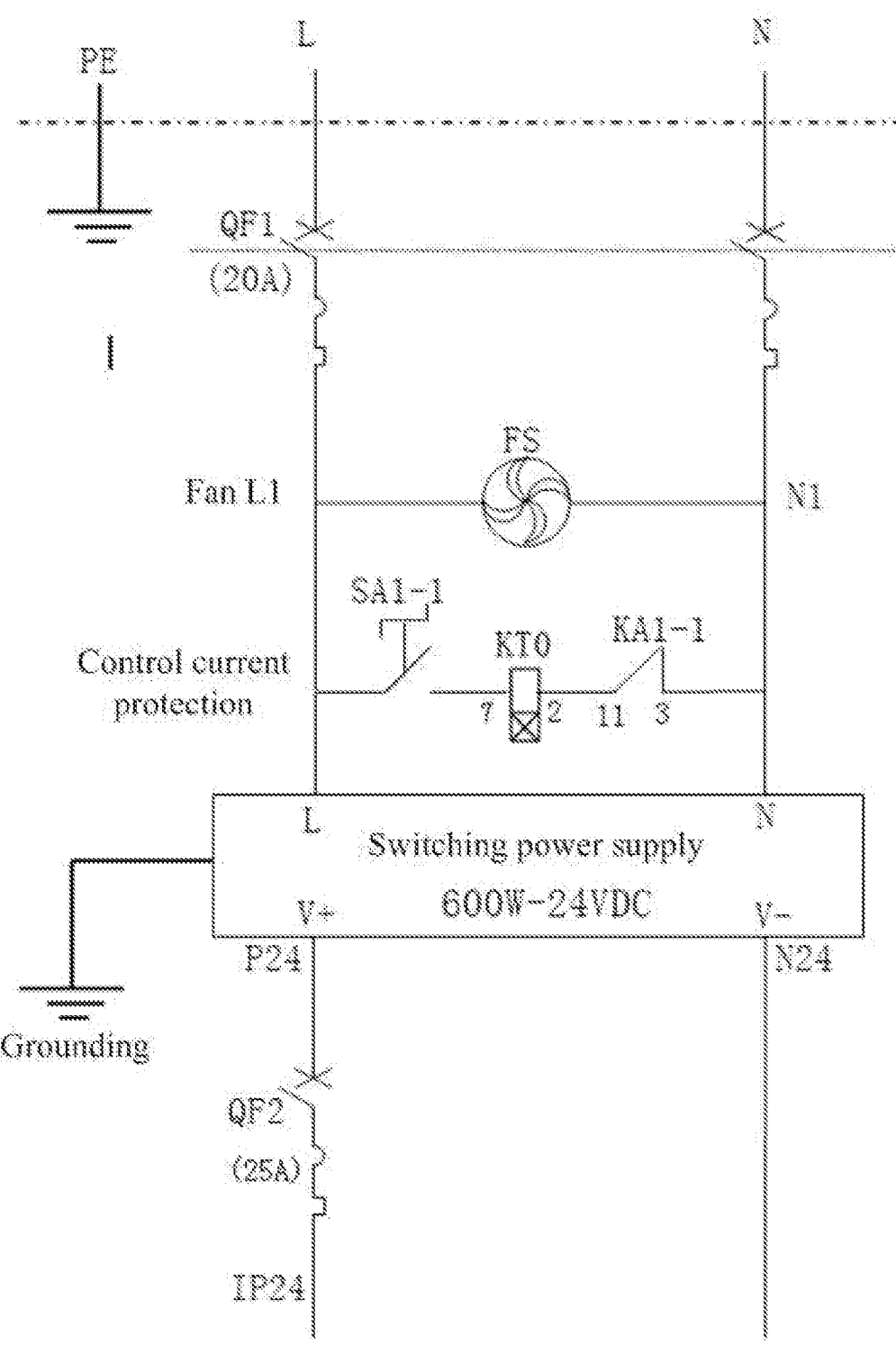
FIG. 2 is a circuit diagram of a power module of a system for testing performance of a relay contact based on infrared thermal imaging according to the present disclosure.

As shown in FIG. 2, FIG. 3, and FIG. 4, a circuit connection of the system for testing performance of a relay contact based on infrared thermal imaging according to the present disclosure is described as follows:

The power module is separately connected to the slide rheostat, the DC contactor, and the intermediate relay, and configured to convert a 220 V alternating current (AC) into a 24 V DC and supply power to the slide rheostat, the DC contactor, and the intermediate relay.

A positive terminal of the power module is connected to one contact of a third group of contacts of a main contact of the DC contactor. Another contact of the third group of contacts of the main contact of the DC contactor is connected to one terminal of the slide rheostat. The other terminal of the slide rheostat is separately connected to one contact of the tested relay and an output terminal of a coil of the intermediate relay. Another contact of the tested relay is connected to one end of a main circuit of the diverter, and the other end of the main circuit of the diverter is connected to a negative terminal of the power module. A current detection loop terminal of the diverter is connected to a current detection terminal of the ampere-voltage meter. A voltage detection terminal of the ampere-voltage meter is connected to the positive terminal of the power module. An input terminal of the coil of the intermediate relay is connected to one contact of a second group of contacts of the main contact of the DC contactor. Another contact of the second group of contacts of the main contact of the DC contactor is connected to the positive terminal of the power module. An input terminal of a coil of the tested relay is connected to one contact of the second group of contacts of the main contact of the DC contactor. An output terminal of the coil of the tested relay is connected to one of normally open contacts of the second time relay. Another one of the normally open contacts of the second time relay is connected to the negative terminal of the power module.

The positive terminal of the power module is connected to one contact of a first group of contacts of the main contact of the DC contactor. Another contact of the first group of contacts of the main contact of the DC contactor is separately connected to an input terminal of a coil of the first time relay and an input terminal of a coil of the second time relay. An output terminal of the coil of the first time relay is connected to one of power-on off-delay contacts of the second time relay. Another one of the power-on off-delay contacts of the second time relay is connected to the negative terminal of the power module. An output terminal of the coil of the second time relay is connected to one of normally open contacts of the first time relay. Another one of the normally open contacts of the first time relay is connected to the negative terminal of the power module.

The positive terminal of the power module is connected to one terminal of the power switch. Another terminal of the power switch is connected to an input terminal of a coil of the DC contactor. An output terminal of the coil of the DC contactor is connected to the negative terminal of the power module.

Specifically, the positive terminal of the power module is connected to a fourth wiring terminal of the counter. The negative terminal of the power module is connected to a third wiring terminal of the counter. A first wiring terminal of the counter is connected to one contact of a third group of normally open contacts of the intermediate relay. A second wiring terminal of the counter is connected to another contact of the third group of normally open contacts of the intermediate relay. A first wiring terminal of the timer is connected to one contact of a second group of normally open contacts of the intermediate relay. A second wiring terminal of the timer is connected to another contact of the second group of normally open contacts of the intermediate relay.

Further, the time relay further includes a third time relay, and the testing device further includes an AC switch. One of normally closed contacts of the third time relay is connected to the output terminal of the coil of the DC contactor, and another one of the normally closed contacts of the third time relay is connected to the negative terminal of the power module. An input terminal of the power module is connected to the 220V AC, and an output terminal of the power module outputs the 24 V DC. A live line (L) terminal of the 220V AC is connected to one terminal of the AC switch, and another terminal of the AC switch is connected to an input terminal of a coil of the third time relay. An output terminal of the coil of the third time relay is connected to one contact of a first group of normally closed contacts of the intermediate relay, and another contact of the first group of normally closed contacts of the intermediate relay is connected to a neutral line (N) terminal of the 220V AC.

In a practical application, a power module is specifically as follows: L and the N terminals of an AC are respectively connected to L1 and N1 terminals through an air switch QF1 20A, and a cooling fan is connected between the L1 and N1 terminals. The L1 terminal is also connected to one terminal of an AC switch SA1-1, and another terminal of the AC switch SA1-1 is connected to a pin 7 of a third time relay KT0. A pin 2 of the third time relay KT0 is connected to a pin 11 of an intermediate relay KA1, and a pin 3 of the intermediate relay KA1 is connected to the N1 terminal. The L1 and N1 terminals of the AC are respectively connected to L and N terminals of a 600 W-24V switching power supply. Output terminals of the 600 W-24V switching power supply are P24 and N24 terminals. The P24 terminal is a positive terminal, and the N24 terminal is a negative terminal. The P24 terminal is connected to one terminal of an air switch QF2 25A, and another terminal of the air switch QF2 25A is connected to an IP24 terminal.

Specifically, a protecting earthing (PE) line is connected to a body of an electrical box. An upper terminal (incoming line terminal) of a circuit breaker QF1 (20A) is connected to L and N of an incoming power supply, and L1 and N1 are led out of a lower terminal (outgoing line terminal) of the circuit breaker QF1 (where the L and the L1 are live lines, and the N and the N1 are neutral lines). A power cord of a fan FS is separately connected to the L1 and the N1. One terminal of a first group of contacts SA1-1 of a rotary switch SA1 is connected to the L1, and another terminal of the first group of contacts SA1-1 of the rotary switch SA1 is connected to a terminal 7 of the time relay KT0. A terminal 2 of the KT0 is connected to a terminal 11 of the KA1, and a terminal 3 of the KA1 is connected to the N1. Internal L and N terminals of a switching power supply (600 W-24 VDC) are respectively connected to the L1 and the N1, a grounding terminal is connected to the body of the electrical box, and internal V+ and V− terminals are respectively connected to P24 and N24 terminals (where the P24 terminal is a positive terminal of a 24V DC power supply and the N24 terminal is a negative terminal of the 24V DC power supply). An upper terminal (incoming line terminal) of a circuit breaker QF2 (25A) is connected to the P24 terminal, and a 1P24 terminal is led out of a lower terminal (outgoing line terminal) of the circuit breaker QF2 (the 1P24 terminal is a positive terminal of the 24V DC power supply).

In a practical application, the IP24 terminal is connected to one terminal of a power switch SA1-2, and another terminal of the power switch SA1-2 is connected to an A1 terminal of a DC contactor KM1. An A2 terminal of the DC contactor KM1 is connected to a pin 5 of the third time relay KT0. A pin 8 of the third time relay KT0 is connected to the N24 terminal.

Specifically, one terminal of a second group of contacts SA1-2 of the rotary switch SA1 is connected to the 1P24 terminal, and another terminal of the second group of contacts SA1-2 of the rotary switch SA1 is connected to the A1 terminal of the DC contactor KM1. An A2 terminal of the DC contactor KM1 is connected to a terminal ⑤ of the time relay KT0, and a terminal ⑧ of the time relay KT0 is connected to the N24 terminal.

The IP24 terminal is connected to one terminal of an auxiliary contact (NO) of the DC contactor KM1, and another terminal of the auxiliary contact (NO) of the DC contactor KM1 is connected to one terminal of an indicator light HL1. Another terminal of the indicator light HL1 is connected to the N24 terminal.

The IP24 terminal is connected to one terminal of a normally open contact KM1-1 of the DC contactor, and another terminal of the normally open contact KM1-1 of the DC contactor is connected to a pin 7 of a first time relay KT1. A pin 2 of the first time relay KT1 is connected to a pin 5 of a second time relay KT2, and a pin 8 of the second time relay KT2 is connected to the N24 terminal. The another terminal of the normally open contact KM1-1 of the DC contactor is connected to a pin 7 of the second time relay KT2. A pin 2 of the second time relay KT2 is connected to a pin 6 of the first time relay KT1, and a pin 8 of the first time relay KT1 is connected to the N24 terminal.

Specifically, one terminal of a first group of contacts KM1-1 of a main contact of the DC contactor is connected to the 1P24 terminal, and another terminal of the first group of contacts KM1-1 of the main contract of the DC contactor is connected to terminals ⑦ of the time relays KT1 and KT2. A terminal ② of the time relay KT1 is connected to a terminal ⑥ of the time relay KT2, a terminal ② of the time relay KT2 is connected to a terminal ⑥ of the time relay KT1, and terminals ⑧ of the time relays KT1 and KT2 is connected to the N24 terminal.

The IP24 terminal is connected to one terminal of a normally open contact KM1-2 of the DC contactor, and another terminal of the normally open contact KM1-2 of the DC contactor is connected to a pin 14 of a tested relay KA2. A pin 13 of the tested relay KA2 is connected to a pin 1 of the second time relay, and a pin 3 of the second time relay is connected to the N24 terminal. The another terminal of the normally open contact KM1-2 of the DC contactor is connected to a pin 14 of the intermediate relay KA1. A pin 13 of the intermediate relay KA1 is connected to a pin 9 of the tested relay. A pin 5 of the tested relay is connected to one terminal of a main circuit of a diverter FL (50 A diverter). Another terminal of the main circuit of the diverter FL (50 A diverter) is connected to the N24 terminal. A current detection loop terminal of the diverter FL (50 A diverter) is connected to a current detection terminal of an ampere-voltage meter A. A voltage detection terminal of the ampere-voltage meter A is connected to the IP24 terminal.

Specifically, one terminal of a second group of contacts KM1-2 of the main contact of the DC contactor is connected to the 1P24 terminal, and another terminal of the second group of contacts KM1-2 of the main contact of the DC contactor is connected to terminals 14 of the intermediate relay KA1 and intermediate relay KA2 (namely the tested relay KA2). A terminal 13 of the intermediate relay KA2 is connected to terminal ① of the time relay KT2. A terminal ③ of the time relay KT2 is connected to the N24 terminal. A terminal 13 of the intermediate relay KA1 is connected to a terminal ⑨ of the intermediate relay KA2. A terminal ⑤ of the intermediate relay KA2 is connected to the one terminal of the main circuit of the diverter FL (50 A diverter), and the another terminal of the main circuit of the diverter FL (50 A diverter) is connected to the N24 terminal. The current detection loop terminal of the diverter FL (50 A diverter) is connected to the current detection terminal of the ampere-voltage meter A, and the voltage detection terminal of the ampere-voltage meter A is connected to the 1P24 terminal.

The IP24 terminal is connected to one terminal of a normally open contact KM1-3 of the DC contactor, and another terminal of the normally open contact KM1-3 of the DC contactor is connected to one pin of a slide rheostat.

Another pin of the slide rheostat is separately connected to the pin 13 of the intermediate relay KA1 and the pin 9 of the tested relay KA2.

Specifically, one terminal of a third group of contacts KM1-3 of the main contact of the DC contactor is connected to the 1P24 terminal, and another terminal of the third group of contacts KM1-3 of the main contact of the DC contactor is connected to the slide rheostat R (slide rheostat). Another terminal of the slide rheostat R (slide rheostat) is connected to the terminal ⑨ of the intermediate relay KA2.

The IP24 terminal is connected to a pin 4 of a counter C1, and a pin 3 of the counter C1 is connected to the N24 terminal. A pin 1 of the counter C1 is connected to a pin 9 of a normally open contact KA1-3 of the intermediate relay. A pin 2 of the counter C1 is connected to a pin 5 of the normally open contact KA1-3 of the intermediate relay.

Specifically, for the counter C1, a terminal ④ is connected to the 1P24, a terminal ③ is connected to the N24 terminal, a terminal ① is connected to a terminal ⑨ of the intermediate relay KA1, and a terminal ② is connected to a terminal ⑤ of the intermediate relay KA1.

A pin 1 of a timer T1 is connected to a pin 6 of a normally open contact KA1-2 of the intermediate relay. A pin 2 of the timer T1 is connected to a pin 10 of the normally open contact KA1-2 of the intermediate relay. The timer T1 has a built-in battery. Pins 3 and 4 of the timer T1 cannot be connected to an external power supply, but can be short circuited for resetting the timer T1.

Specifically, for the timer T1, a terminal ① is connected to a terminal ⑥ of the intermediate relay KA1, a terminal ② is connected to a terminal ⑩ of the intermediate relay KA1, and terminals ③ and ④ cannot be connected to the external power supply, but can be short circuited for resetting the timer.

In the present disclosure, the positive terminal of the power module is the 1P24 terminal, the negative terminal of the power module is the N24 terminal, the DC contactor is the KM1, the third group of contacts of the main contact of the DC contactor is the KM1-3, the tested relay is the KA2, the intermediate relay is the KA1, the second group of contacts of the main contact of the DC contactor is the KM1-2, the first group of contacts of the main contact of the DC contactor is KM1-1, the second time relay is the KT2, the first time relay is the KT1, the third time relay is the KT0, the power switch is the SA1-2, the AC switch is the SA1-1, the third group of normally open contacts of the intermediate relay is the KA1-3, the second group of normally open contacts of the intermediate relay is the KA1-2, and the first group of normally closed contacts of the intermediate relay is the KA1-1.

In addition, the system further includes a testing base, and the tested relay is connected to the testing device through the testing base. The testing base is a relay base.

In a practical application, the testing device is disposed in an electric control cabinet. The testing device further includes a cooling fan, an air switch QF1, and an air switch QF2. The display screen includes a current and voltage display screen, a counter display screen, and a timer display screen. The infrared thermal imager whose model is T640 performs temperature collection and display. The switching power supply whose model is MEANWELL SE-600-24 can convert the 220 V AC into the 24 V DC. The slide rheostat is a customized slide rheostat. At present, a range of a current flowing through the contact of the intermediate relay is 1 A to 10 A. Therefore, a theoretically designed resistance value of the slide rheostat ranges from 1.2Ω to 10Ω. An output current of the slide rheostat ranges from 2.4 A to 20

A by changing the resistance value. The DC contactor KM1 whose model is TeSys LC1D is used for protection in the main circuit. When the contact or the coil is burned out, a 24 V power supply is cut off. There are three AH3-3 DC 24 V time relays. The third time relay is the KT0, which is connected to the DC contactor for protection. Time is set to simulate automatic disconnection of the DC contactor when the coil or the contact is burned out, such that the relay is no longer closed, protecting a 24 V circuit. The first time relay KT1 and the second time relay KT2 are used for cyclic counting to ensure that the intermediate relay continues to operate based on the set time. The cooling fan is mainly configured to cool the testing device and is directly connected to the air switch. The air switch QF1 (with leakage protection) whose model is DELixi 2P is connected to a 220 V power supply to protect an AC circuit. The air switch QF2 whose model is CHNT NBE71P is connected to the 24 V power supply to control on/off of a circuit and protect a DC circuit from being burned out. The intermediate relay KA1 outputs time and count values by measuring KA1 parameters. The tested intermediate relay KA2 can be easily and quickly plugged and replaced, thereby improving efficiency. The current and voltage display screen can display current and voltage of a tested circuit, where the voltage is designed to be 24 V and the current is an actual test current. The counter display screen can display a closing quantity of the contact of the tested intermediate relay from when the tested intermediate relay is started to when the tested intermediate relay is burned out (powered off). The timer display screen can display time from when the tested intermediate relay is started to when the tested intermediate relay is burned out (powered off). A model of the counter is JDM11-6H, and a model of the timer is H7ET-BLM.

In addition, when using the system for testing performance of a relay contact based on infrared thermal imaging to test performance of a relay, different users can adjust parameters of the testing system based on a testing need and parameters of the tested relay. Temperature thresholds for normal operation of different relays can be obtained based on a plurality of experiments. Based on the thresholds, it can be determined whether the tested relay is in a normal working state.

A working principle of the system for testing performance of a relay contact based on infrared thermal imaging according to the present disclosure is described as follows:

The performance of the contact can be tested by using the testing device. The testing device can adjust the current flowing through the contact to be consistent with a designed working condition. The testing device can adjust closing and release time of the contact to be consistent with a design working condition. Under the action of the current, the contact is continuously closed and released. After running for a period of time, the infrared thermal imager collects a surface temperature distribution map of the contact and interprets the surface temperature distribution map automatically to determine the performance of the contact. When a problem occurs on the performance of the contact of the relay, corresponding contact resistance changes significantly, and heat also changes significantly under the action of the current according to the Joule's law. The temperature of the contact can be collected by the infrared thermal imager, and whether the performance of the contact is normal is further determined based on the collected temperature of the contact. In addition, a temperature warning value of the infrared thermal imager can be set to automatically detect whether the performance meets a requirement.

The system for testing performance of a relay contact based on infrared thermal imaging according to the present disclosure has following advantages:

1. The testing system can effectively test the performance of the contact of the relay.
2. The testing system can change closing and release rates of the contact by changing parameter settings of the time relays KT0, KT1, and KT2, to test the performance of the contact under different closing and release rates. This can better simulate an actual working condition of the contact of the relay. In this way, the testing can better reflect the actual working condition and the performance of the contact.
3. The resistance value of the slide rheostat is changed externally to test the performance of the contact under the action of different currents.
4. Parameters of each component in the testing system are set based on an actual situation, thereby meeting a testing requirement.
5. The tested relay in the testing system can be directly plugged and unplugged on the testing base without changing any circuit and testing instrument, making it easy to operate. A function of automatically reporting an alarm when the temperature exceeds a limit can be set by using the infrared thermal imager or a PC, achieving automatic discrimination of testing performance without a need for manual summarization and statistics. This is simple and can simultaneously test a plurality of samples of a same batch.
6. The infrared thermal imager adopts non-contact temperature measurement, ensuring safety.

Embodiment 2

To execute the system corresponding to Embodiment 1 to achieve corresponding functions and technical effects, the following provides a method for testing performance of a relay contact based on infrared thermal imaging. The method includes:

Steps S1: Close a coil of a DC contactor.

Step S2: Adjust a resistance value of a slide rheostat to enable a current detected by an ampere-voltage meter to reach a specified current value, where the specified current value is determined based on a parameter of a tested relay.

Step S3: Adjust a first time relay and a second time relay to ensure that a time interval between closing and release of a contact of the tested relay meets a specified threshold, where the specified threshold is determined based on the parameter of the tested relay.

Step S4: Collect a temperature of the contact of the tested relay within a specified time period by using an infrared thermal imager.

Step S5: Determine a maximum working temperature of the contact of the tested relay based on the temperature.

Figure 5:
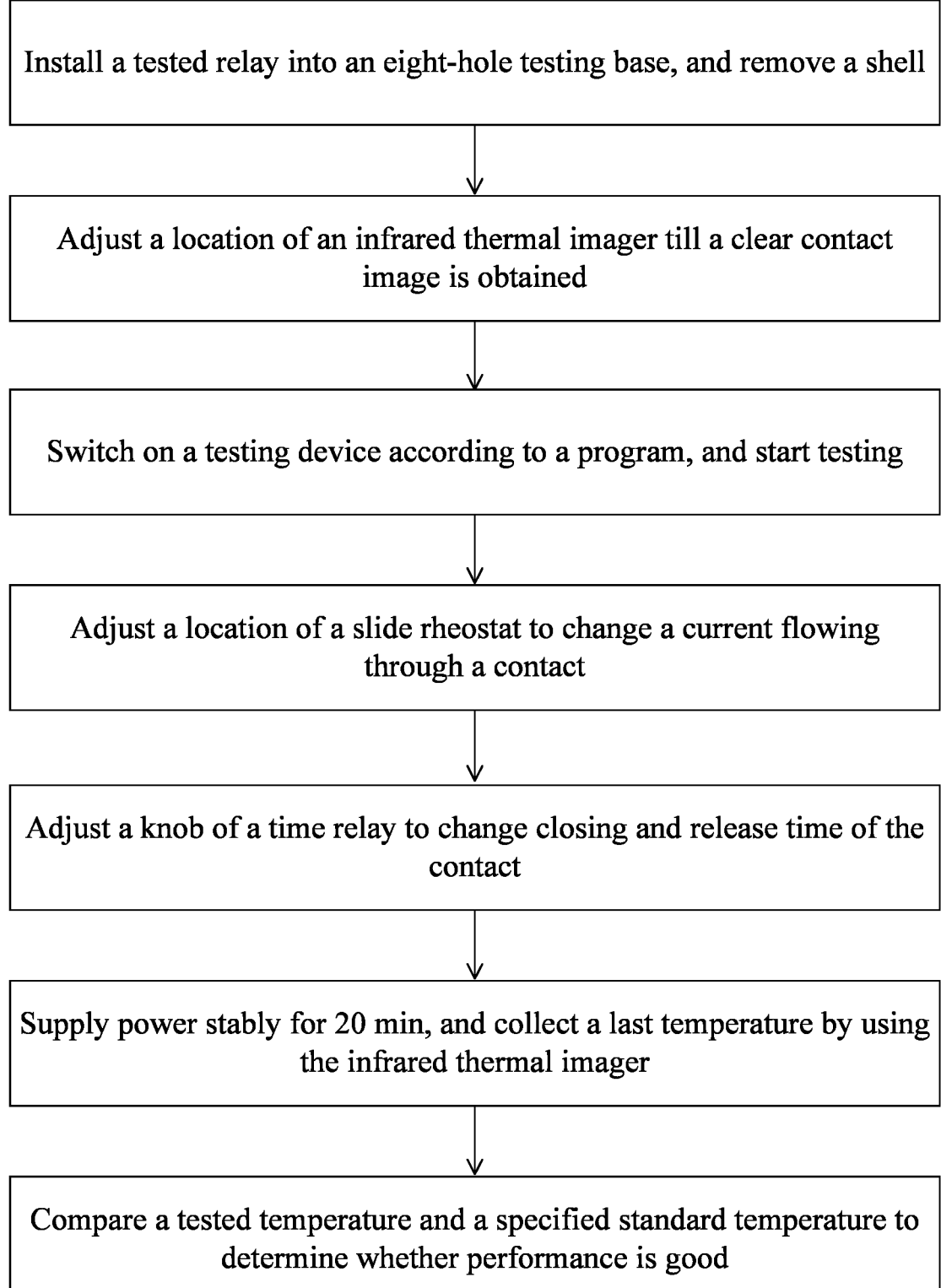
FIG. 5 is a flowchart of a method for testing performance of a relay contact based on infrared thermal imaging according to the present disclosure.

As shown in FIG. 5, an actual test process of the method for testing performance of a relay contact based on infrared thermal imaging according to the present disclosure is described as follows:

(1) Insert the tested relay into a testing base and remove a shell.

(2) Turn on the infrared thermal imager, perform parameter setting based on a user manual, align the infrared thermal imager with the tested relay to obtain a clear infrared image.

(3) Connect the testing device to a 220 V power supply, set a main knob to ON, turn on QF1, power on the testing device, and start a cooling fan.

(4) Turn on QF2 and power on a test circuit.

(5) Set KM1 to "ON" to protect the circuit.

(6) Rotate a handle of the slide rheostat until a displayed current meets a test requirement (the test requirement is determined based on a test purpose and the parameter of the tested relay, and different relays have different current values, which can generally be set to 1 A, 3 A, 5 A, 7 A, and 9 A).

(7) Adjust knobs of the KT0, the KT1, and the KT2 in sequence based on the test purpose and the parameter of the tested relay, to ensure that closing and release time of the contact of the relay meets a test requirement (the test requirement is determined based on the test purpose and the parameter of the tested relay, and is generally an actual time interval between the closing and the release of the tested relay, such as 30 ms or 20 s, which is achieved through knob adjustment).

(8) After running for a period of time, collect a highest temperature and an infrared atlas of the contact by using the infrared thermal imager (maintain a current state without repetition, in other words, keep set parameters in (7) for running for a period of time, supply power for a period of time, and perform collection after a temperature rise).

(9) An enterprise determines temperature ranges of different qualified relays under different currents and different on/off time based on a large number of experiments, and determines, based on the temperature ranges, whether the temperature of the contact meets a requirement (due to different relays and different testing environment standards, a large number of experiments are required to determine corresponding temperature ranges).

Each embodiment in the specification is described in a progressive mode, each embodiment focuses on differences from other embodiments, and references can be made to each other for the same and similar parts between embodiments.

Particular examples are used herein for illustration of principles and implementations of the present disclosure. The descriptions of the above embodiments are merely used for assisting in understanding the method of the present disclosure and its core ideas. In addition, those of ordinary skill in the art can make various modifications in terms of particular implementations and the scope of application in accordance with the ideas of the present disclosure. In conclusion, the content of the specification shall not be construed as limitations to the present disclosure.

What is claimed is:

1. A system for testing performance of a relay contact based on infrared thermal imaging, wherein the system comprises a collection device, a testing device, and a time relay;

the testing device is separately connected to a tested relay and the time relay, and configured to control closing and release of a contact of the tested relay by using the time relay; and the collection device is connected to the testing device, and configured to collect a temperature, a closing quantity, and working duration of the contact of the tested relay.

2. The system for testing performance of a relay contact based on infrared thermal imaging according to claim 1, wherein the collection device comprises an infrared thermal imager, a counter, and a timer.

3. The system for testing performance of a relay contact based on infrared thermal imaging according to claim 2, wherein the collection device further comprises an ampere-voltage meter, and the ampere-voltage meter is configured to detect a value of a current flowing through the contact of the tested relay.

4. The system for testing performance of a relay contact based on infrared thermal imaging according to claim 3, wherein the testing device comprises a power module, a power switch, a slide rheostat, a direct current (DC) contactor, a diverter, and an intermediate relay; and the time relay comprises a first time relay and a second time relay;

the power module is separately connected to the slide rheostat, the DC contactor, and the intermediate relay, and configured to convert a 220 V alternating current (AC) into a 24 V DC and supply power to the slide rheostat, the DC contactor, and the intermediate relay;

a positive terminal of the power module is connected to one contact of a third group of contacts of a main contact of the DC contactor; another contact of the third group of contacts of the main contact of the DC contactor is connected to one terminal of the slide rheostat; the other terminal of the slide rheostat is separately connected to one contact of the tested relay and an output terminal of a coil of the intermediate relay; another contact of the tested relay is connected to one end of a main circuit of the diverter; the other end of the main circuit of the diverter is connected to a negative terminal of the power module; a current detection loop terminal of the diverter is connected to a current detection terminal of the ampere-voltage meter; a voltage detection terminal of the ampere-voltage meter is connected to the positive terminal of the power module; an input terminal of the coil of the intermediate relay is connected to one contact of a second group of contacts of the main contact of the DC contactor; another contact of the second group of contacts of the main contact of the DC contactor is connected to the positive terminal of the power module; an input terminal of a coil of the tested relay is connected to one contact of the second group of contacts of the main contact of the DC contactor; an output terminal of the coil of the tested relay is connected to one of normally open contacts of the second time relay; and another one of the normally open contacts of the second time relay is connected to the negative terminal of the power module;

the positive terminal of the power module is connected to one contact of a first group of contacts of the main contact of the DC contactor; another contact of the first group of contacts of the main contact of the DC contactor is separately connected to an input terminal of a coil of the first time relay and an input terminal of a coil of the second time relay; an output terminal of the coil of the first time relay is connected to one of power-on off-delay contacts of the second time relay; another one of the power-on off-delay contacts of the second time relay is connected to the negative terminal of the power module; an output terminal of the coil of the second time relay is connected to one of normally open contacts of the first time relay; and another one of the normally open contacts of the first time relay is connected to the negative terminal of the power module; and

15 the positive terminal of the power module is connected to one terminal of the power switch; another terminal of the power switch is connected to an input terminal of a coil of the DC contactor; and an output terminal of the coil of the DC contactor is connected to the negative terminal of the power module.

5. The system for testing performance of a relay contact based on infrared thermal imaging according to claim 4, wherein the positive terminal of the power module is connected to a fourth wiring terminal of the counter; and the negative terminal of the power module is connected to a third wiring terminal of the counter; and a first wiring terminal of the counter is connected to one contact of a third group of normally open contacts of the intermediate relay; and a second wiring terminal of the counter is connected to another contact of the third group of normally open contacts of the intermediate relay.

6. The system for testing performance of a relay contact based on infrared thermal imaging according to claim 4, wherein a first wiring terminal of the timer is connected to one contact of a second group of normally open contacts of the intermediate relay; and a second wiring terminal of the timer is connected to another contact of the second group of normally open contacts of the intermediate relay.

7. The system for testing performance of a relay contact based on infrared thermal imaging according to claim 4, wherein a resistance range of the slide rheostat is 1.2 $\Omega$ to 10 $\Omega$.

8. The system for testing performance of a relay contact based on infrared thermal imaging according to claim 4, wherein the time relay further comprises a third time relay, and the testing device further comprises an AC switch;

one of normally closed contacts of the third time relay is connected to the output terminal of the coil of the DC contactor; and another one of the normally closed contacts of the third time relay is connected to the negative terminal of the power module;

16 an input terminal of the power module is connected to the 220V AC; and an output terminal of the power module outputs the 24 V DC; and a live line (L) terminal of the 220V AC is connected to one terminal of the AC switch; another terminal of the AC switch is connected to an input terminal of a coil of the third time relay;

an output terminal of the coil of the third time relay is connected to one contact of a first group of normally closed contacts of the intermediate relay; and another contact of the first group of normally closed contacts of the intermediate relay is connected to a neutral line (N) terminal of the 220V AC.

9. The system for testing performance of a relay contact based on infrared thermal imaging according to claim 8, wherein the testing system further comprises a testing base; and the tested relay is connected to the testing device through the testing base.

10. A method for testing performance of a relay contact based on infrared thermal imaging, comprising:

closing a coil of a DC contactor;

adjusting a resistance value of a slide rheostat to enable a current detected by an ampere- voltage meter to reach a specified current value, wherein the specified current value is determined based on a parameter of a tested relay;

adjusting a first time relay and a second time relay to ensure that a time interval between closing and release of a contact of the tested relay meets a specified threshold, wherein the specified threshold is determined based on the parameter of the tested relay;

collecting a temperature of the contact of the tested relay within a specified time period by using an infrared thermal imager; and determining a maximum working temperature of the contact of the tested relay based on the temperature.

\* \* \* \* \*